US010388376B2

(12) United States Patent
Molas et al.

(10) Patent No.: US 10,388,376 B2
(45) Date of Patent: Aug. 20, 2019

(54) METHOD FOR MANAGING THE ENDURANCE OF A NON-VOLATILE REWRITABLE MEMORY AND DEVICE FOR PROGRAMMING SUCH A MEMORY

(71) Applicant: COMMISSARIAT A L'ENERGIE ATOMIQUE ET AUX ENERGIES ALTERNATIVES, Paris (FR)

(72) Inventors: Gabriel Molas, Grenoble (FR); Michel Harrand, Saint-Egreve (FR); Elisa Vianello, Grenoble (FR); Cécile Nail, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/975,249

(22) Filed: May 9, 2018

(65) Prior Publication Data
US 2018/0330786 A1    Nov. 15, 2018

(30) Foreign Application Priority Data
May 9, 2017  (FR) ..................... 17 54043

(51) Int. Cl.
*G11C 11/00*      (2006.01)
*G11C 13/00*      (2006.01)
*G11C 29/02*      (2006.01)
*G11C 11/56*      (2006.01)
*H01L 27/10*      (2006.01)
*H01L 27/24*      (2006.01)

(52) U.S. Cl.
CPC ...... *G11C 13/0069* (2013.01); *G11C 11/5685* (2013.01); *G11C 13/0007* (2013.01);
(Continued)

(58) Field of Classification Search
CPC ............ G11C 13/0069; G11C 11/5685; G11C 13/0007; G11C 13/0033; G11C 29/021
(Continued)

(56) References Cited
U.S. PATENT DOCUMENTS 5,738,731 A * 4/1998  Shindo ................. B81C 1/0038
                                                                136/249
6,025,252 A * 2/2000  Shindo ................. B81C 1/0038
                                                                136/249
(Continued)

OTHER PUBLICATIONS

Search Report as issued in French Patent Application No. 1754043, dated Jan. 18, 2018.

*Primary Examiner* — Harry W Byrne
(74) *Attorney, Agent, or Firm* — Pillsbury Winthrop Shaw Pittman, LLP (57) ABSTRACT

A method for managing the endurance of a non-volatile rewritable memory including memory cells each including an ordered stack of a lower electrode, a layer of dielectric material and an upper electrode, the dielectric material switching between a high resistance state and a low resistance state, or vice versa, to enable a writing in the memory cell or an erasure of the memory cell. The method includes at the end of each writing and erasure cycle, reading the erasure conditions of the memory cell in the course of the final erasure operation of the cycle, and comparing the read erasure conditions with a predetermined median erasure value corresponding to a median resistance value which follows a predetermined dependency law linking the condition of erasure of a cycle with the condition of writing of a following cycle; and determining the writing conditions from the results of the comparison.

10 Claims, 4 Drawing Sheets

(52) U.S. Cl.
CPC ........ *G11C 13/0033* (2013.01); *G11C 29/021* (2013.01); *G11C 29/028* (2013.01); *H01L 27/101* (2013.01); *H01L 27/2436* (2013.01); *G11C 13/0011* (2013.01); *G11C 2013/009* (2013.01); *G11C 2013/0076* (2013.01); *G11C 2013/0092* (2013.01)

(58) Field of Classification Search
USPC .......................................................... 365/148
See application file for complete search history.

(56) References Cited

U.S. PATENT DOCUMENTS

| | | | | |
|---|---|---|---|---|
| 6,106,734 | A * | 8/2000 | Shindo | B81C 1/0038 117/9 |
| 6,137,120 | A * | 10/2000 | Shindo | B81C 1/0038 257/347 |
| 6,177,706 | B1 * | 1/2001 | Shindo | B81C 1/0038 257/347 |
| 6,225,668 | B1 * | 5/2001 | Shindo | B81C 1/0038 257/296 |
| 6,677,214 | B1 * | 1/2004 | Shindo | B81C 1/0038 257/E27.111 |
| 9,558,823 | B1 | 1/2017 | Khwa et al. | |
| 2007/0063180 | A1 * | 3/2007 | Asano | H01L 27/2436 257/3 |
| 2010/0284212 | A1 | 11/2010 | Bedeschi et al. | |
| 2013/0058153 | A1 | 3/2013 | Chang et al. | |
| 2014/0029330 | A1 | 1/2014 | Muraoka et al. | |

\* cited by examiner

METHOD FOR MANAGING THE ENDURANCE OF A NON-VOLATILE REWRITABLE MEMORY AND DEVICE FOR PROGRAMMING SUCH A MEMORY

CROSS REFERENCE TO RELATED APPLICATIONS

This application claims priority to French Patent Application No. 1754043, filed May 9, 2017, the entire content of which is incorporated herein by reference in its entirety.

FIELD

The present invention relates to a method for managing the endurance of a non-volatile rewritable memory. The invention also relates to a device for programming such a non-volatile rewritable memory.

The invention finds applications in the field of non-volatile rewritable memories and, more specifically, that of resistive random access memories of OxRRAM (Oxide-based Resistive RAM) and CBRAM (Conductive Bridging RAM) type.

BACKGROUND

In the field of non-volatile rewritable memories, different types of memories are used as a function of the targeted applications and performances. The memories the most commonly used, in particular in digital cameras, cell phones, portable computers, USB keys, and other portable devices, are memories called "Flash memories". Flash memories offer, notably, high integration density, high impact resistance, and good durability.

Most commercially available non-volatile Flash memories use the storage of charges as principle for encoding information. In practice, a charge trapping layer (generally polysilicon, or a dielectric such as SiN) is encapsulated between two dielectrics in the gate stack of an MOS transistor. The presence or the absence of charge in this medium modifies the conduction of the MOS transistor and makes it possible to encode the state of the memory.

However, the evolution of microelectronics requires every greater miniaturisation of components and, in particular, non-volatile rewritable memories. Yet, the miniaturisation of Flash technology is limited, notably by the fact that the thickness of the charge trapping layer cannot be reduced below a minimum value (of the order of 6 nm) otherwise the information retention time would be decreased.

Recently, a new type of memory, called resistive random access memories, have appeared to replace Flash memories. These resistive random access memories are not based on the charge trapping of the gates of transistors, but on a change of state of a resistive block. Resistive random access memories, notably oxide-based resistive random access memories, known as OxRRAM, and resistive random access memories based on ion conducting material, known as CBRAM (conductive bridging random access memories), are based on a change of the resistance state (high or low resistance) of an active material integrated between two metal electrodes. This new type of memory enables not only high integration density but also high operating speed, great endurance and good compatibility with the manufacturing methods currently used in the microelectronics industry, in particular with end-of-line CMOS technology methods.

Figure 1:
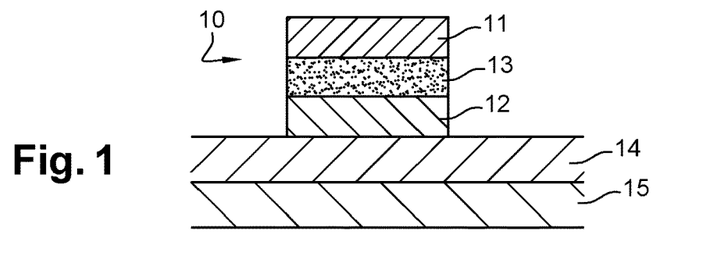
FIG. 1, already described, schematically represents an example of a memory cell of a resistive random access memory.

A resistive random access memory generally includes a plurality of memory cells, also called memory points. Each memory cell 10 comprises a stack of a first and a second electrodes, generally made of metal, and a layer made of active material, for example a metal oxide, arranged between the two electrodes. An example of a resistive random access memory cell is represented in FIG. 1. This resistive random access memory comprises a first electrode 11, a second electrode 12 and a layer made of dielectric material 13 laid out between the first and second electrodes. The second electrode 12 of the resistive random access memory is arranged in contact with a connector substrate 14 ensuring an electrical contact between a programming device and the stack. The programming device makes it possible to control the programming conditions, for example the programming voltage, applied to the electrodes 11 and 12 of the stack.

The layer made of dielectric material 13, also called active layer, is capable of switching, in a reversible manner, between two resistance states which correspond to the logic values "0" and "1" used to encode an information bit. Thus, a resistive random access memory stack can switch from a low resistance state (LRS) to a high resistance state (HRS) by the application of a first voltage VRESET between the first 11 and the second 12 electrodes, and to switch back from the high resistance state HRS to the low resistance state LRS by the application of a second voltage VSET between the first and second electrodes. In particular, an information is written in the memory cell by switching the layer made of dielectric material from the high resistance state HRS, also called "OFF" state, to the low resistance state LRS, or "ON" state. Conversely, an information may be erased from the memory cell by switching the layer made of dielectric material from the state LRS to the state HRS. The writing operation in the memory cell is called "SET"; the erasure operation of the memory cell is called "RESET".

Thus, during a writing operation, the dielectric material comprises a first resistance value and, during an erasure operation, it comprises a second resistance value, less than the first resistance value. The change in resistance of the dielectric material is governed by the formation and the rupture of a conductive filament of nanometric section between the two electrodes 11-12. According to our current state of knowledge, this filament seems to be due to different phenomena, depending on the type of material used for the layer of active material. In particular, in an OxRRAM type resistive random access memory in which the layer of dielectric material is oxide based, the change in resistance state seems to be explained by the formation of a filament of oxygen vacancies within the layer of dielectric material. In a CBRAM type resistive random access memory, in which the layer of dielectric material comprises an ion conducting material forming an ion conducting solid electrolyte arranged between an electrode forming an inert cathode and an electrode comprising a portion of ionisable metal, the change in resistance state seems to be explained by the formation of a conductive filament within the layer of dielectric material.

However, in resistive random access memories, there exists a certain variability in the resistance levels, both in the low resistance state LRS and in the high resistance state HRS. Indeed, at each operation of writing and erasure of the memory, the values of the resistance Roff in the high resistance state HRS and the values of the resistance Ron in the low resistance state LRS fluctuate, as represented by the fluctuation curves of the resistances Roff and Ron of FIG. 2.

Figure 2:
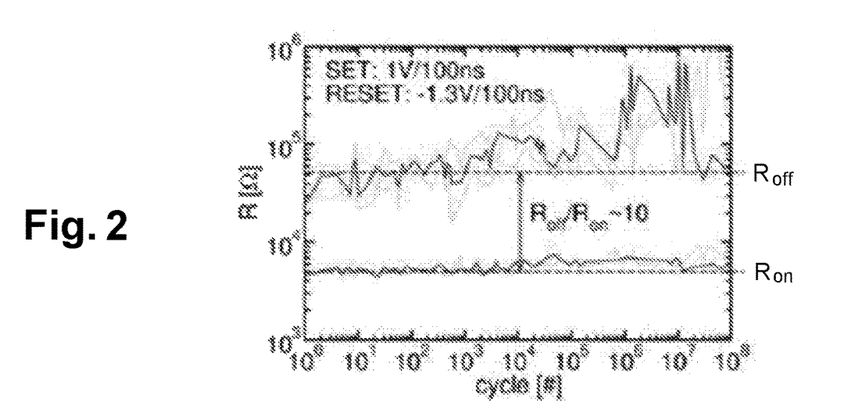
FIG. 2, already described, represents examples of evolution of the resistances Roff and Ron of a memory cell in the course of cycles.

Moreover, as the writing and erasure cycles of the memory progress, the levels of the resistances of the dielectric material drift, moving away more and more from the resistance values of the first cycles, as shown in FIG. 2. On account of these drifts, the writing and erasure conditions—for example the writing voltage or the erasure voltage—have to be modified to enable the writing or the erasure of a dielectric material. These modifications generally consist in applying a very high voltage or, quite the opposite, a very low voltage. Yet, the application of too weak writing or erasure conditions prevents any writing and the application of too strong writing or erasure conditions generates defects in the dielectric material, which degrades the dielectric material. The performances of resistive random access memories thus have a tendency to degrade more and more over cycles of writing and erasure. The endurance performances of these memories are thus relatively restricted.

To overcome this problem of endurance and thereby extend the lifetime of resistive random access memories, it is known to use a so-called "smart programming" method, which has the objective of compensating the defects that have built up in the course of several cycles of writing and erasure of the memory. To do so, the smart programming method proposes applying a programming voltage that increases progressively from a value that is intentionally too low up to a value where the dielectric material reaches a target resistance value. In other words, this method proposes determining a target resistance value considered as the optimal resistance value to reach. A compensation voltage—or a duration or a number of pulses at constant voltage level—intended to reduce the probability of generating a lot of defects in the dielectric material, is next applied from a low value which is increased step by step until the resistance reaches the predetermined target value. The compensation conditions (voltage or pulse duration) are applied to limit defects within the dielectric material not just in its low resistance state but also in its high resistance state.

Figure 3A:
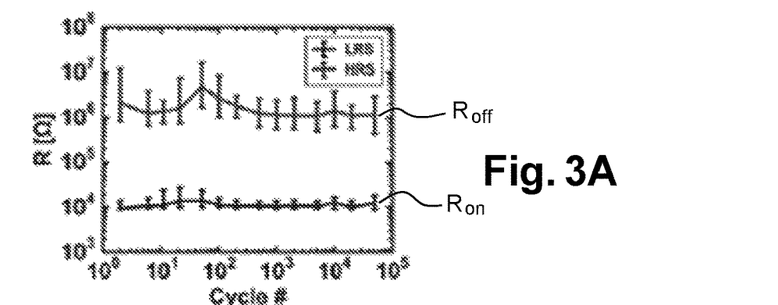
FIGS. 3A and 3B, already described, represent examples of evolution of the resistances Roff and Ron, as a function of the writing and erasing voltages, during an implementation of the smart programming method.
Figure 3B:
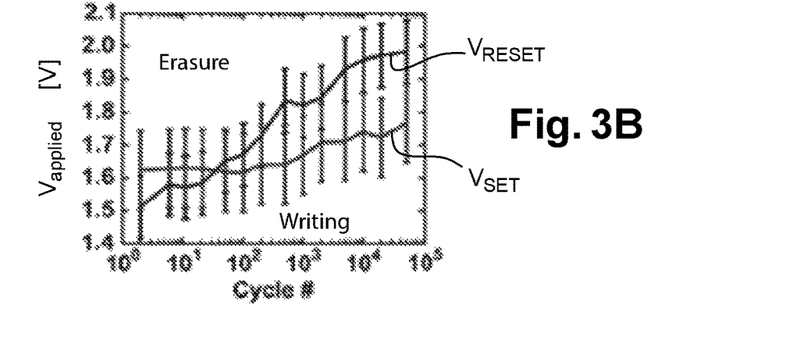

FIGS. 3A and 3B represent curves showing the evolution, respectively, of the resistance values of the dielectric material and the values of the compensation voltage applied to the memory, in the course of a large number of writing and erasure cycles, when a smart programming method is used. It is understood from these curves that, when a writing ("set" curve) and erasure ("reset" curve) compensation voltage is applied, the value of the resistances in the state HRS and in the state LRS of the dielectric material increases. However, this increase in resistance values is only momentary, the resistance values again decreasing rapidly in the course of cycles following the application of the compensation voltage. Indeed, since the compensation voltage is generally only carried out after a certain number of cycles—for example at around $10^2$ and $10^4$ cycles in FIGS. 3A-3B—the memory has already greatly deteriorated when the compensation voltage is applied. This writing and erasure compensation thus camouflages defects generated as the writing and erasure cycles progress, without however repairing them. Indeed, the defects of the dielectric material behind the modification of the resistance levels of the dielectric material are irreversible. Thus it is not possible to repair them, but only to compensate them by writing more and more strongly—and thus by degrading more and more the dielectric material.

Indeed, the application of strong writing and erasure compensation conditions, with the aim of compensating defects generated in the dielectric material, has the effect of generating new defects within the dielectric material.

SUMMARY

To respond to the aforementioned problem of the compensation of defects in the dielectric material, the Applicant proposes a method for managing the endurance of a resistive random access memory in which the writing conditions of the memory to apply during the cycle to come (or following cycle) are determined as a function of the erasure conditions applied during the preceding cycle, in order to limit resistance drifts of the dielectric material at each cycle and, thus, slow down the degradation of the memory.

According to a first aspect, the invention relates to a method for managing the endurance of a non-volatile rewritable memory including a plurality of memory cells each comprising an ordered stack of a lower electrode, a layer of dielectric material and an upper electrode, the dielectric material of each stack being capable of switching between:
 a high resistance state, and
 a low resistance state,
a switching between the high resistance state and the low resistance state allowing a writing in the memory cell and a switching between the low resistance state and the high resistance state allowing an erasure in the memory cell.

This method is characterised by the fact that it comprises the following operations:
 at the end of each writing and erasure cycle of the memory cell, reading the erasure conditions of the memory cell in the course of the final erasure operation of the cycle, and comparing the read erasure conditions with a predetermined median erasure value corresponding to a median resistance value which follows a predetermined dependency law linking the condition of erasure of a cycle with the condition of writing of a following cycle; and
 determining the writing conditions of the memory cell from the results of the comparison, the writing conditions being applied to the electrodes of the stack during writing operations of the following writing and erasure cycle in order to limit the generation of defects in the dielectric material.

The fact of adjusting the writing conditions of the memory cell makes it possible to slow down the generation of defects in the dielectric material at each writing and erasure cycle and, thus, to stabilise the resistance drifts of each memory cell of the resistive random access memory. This stability of resistance drifts increases the endurance of the memory and thus its lifetime.

The dependency law may be calibrated prior to any writing and erasure cycle. This dependency law makes it possible to adapt the method of the invention to all types of resistive random access memories, each type of resistive random access memory having its own dependency law.

According to one alternative, the writing conditions include a writing voltage value applied between the electrodes of each memory cell, for a constant duration, so that the dielectric material switches from the high resistance state to the low resistance state.

According to another alternative, the writing conditions include a duration of application of a voltage of constant value between the electrodes of each memory cell, so that the dielectric material switches from the high resistance state to the low resistance state.

According to certain embodiments, each writing and erasure cycle comprises an alternating series of at least one writing operation and at least one erasure operation. Thus, the term "cycle" defines a series constituted of at least one operation of writing and at least one operation of erasure of data of a memory cell of the resistive random access memory, a writing operation succeeding each erasure operation. In one of the embodiments, the writing and erasure cycle comprises a single writing operation and a single erasure operation. This embodiment offers good precision in the determination of the writing conditions. In another embodiment, the writing and erasure cycle comprises several writing operations and several erasure operations, an erasure operation alternating with a writing operation. This embodiment offers a compromise between precision and programming rapidity.

Beneficially, the read erasure conditions are memorised at least partially up to the following writing and erasure cycle, in at least one memory cell of the non-volatile rewritable memory.

According to a second aspect, the invention relates to a device for programming a non-volatile rewritable memory implementing the above method.

According to certain embodiments, the programming circuit comprises a plurality of voltage generators each capable of generating at least one writing and/or erasure voltage value.

According to other embodiments, the programming circuit comprises at least one voltage generator connected to dividing bridges.

These different embodiments make it possible to vary the writing and/or erasure voltage in order that the voltage applied to the electrodes is as close as possible to the determined voltage value.

According to yet other embodiments, the programming circuit comprises at least one voltage generator connected to at least one counter and/or one clock capable of modulating a duration of application of a constant voltage to the electrodes.

These embodiments make it possible to vary the writing and erasure conditions with a simple and inexpensive circuit.

BRIEF DESCRIPTION OF THE FIGURES

Other benefits and characteristics of the invention will become clear from reading the description, illustrated by the figures in which.

DETAILED DESCRIPTION

An example of a method for managing the endurance of a resistive random access memory is described in detail hereafter, with reference to the appended drawings. This example illustrates the characteristics and benefits of the invention. It is however recalled that the invention is not limited to this example.

In the figures, identical elements are marked by identical references. For reasons of legibility of the figures, the size scales between represented elements are not respected.

The method for managing endurance according to an embodiment of the invention is implemented in a resistive random access memory comprising a plurality of memory cells, of the type of that represented in FIG. 1 described previously. Each memory cell 10 comprises an ordered stack, formed of a lower electrode 12, an upper electrode 11 and a layer of dielectric material 13. This stack is associated with a programming circuit 15 capable of applying a potential difference between the two electrodes 11 and 12. Several memory cells 10 are laid out next to each other, on one or more levels, to form a resistive random access memory.

The layer of dielectric material 13, for example a layer made of hafnium oxide ($HfO_2$), is capable of passing from a low resistance state LRS to a high resistance state HRS, and vice versa, under the effect of a voltage applied between the upper and lower electrodes. In the low resistance state, the dielectric material has a resistance Ron; in the high resistance state, the dielectric material has a resistance Roff, greater than Ron. Switching the dielectric material from the high resistance state HRS to the low resistance state LRS makes it possible to write data; switching the dielectric material from the low resistance state LRS to the high resistance state HRS makes it possible to erase data. Each phase of erasure of data from the memory cell follows on from a phase of writing the data. An alternating series of phases of writing and phases of erasure form a writing and erasure cycle. A writing and erasure cycle, also called cycle, may thus comprise a writing phase followed by an erasure phase; it may also comprise an alternation of several writing phases and several erasure phases.

The method of an embodiment of the invention proposes limiting drifts in the resistances Roff and Ron at each cycle in such a way as to reduce, or even prevent, the formation of defects in the dielectric material 13. To do so, the method of an embodiment of the invention proposes determining the writing conditions to apply to a cycle as a function of the erasure conditions applied at the preceding cycle. Indeed, the fact of writing in the memory cell with writing conditions established as a function of the erasure conditions of the preceding cycle enables the resistance Ron of the dielectric material in the low resistance state LRS to fluctuate around a median resistance value Ronmed. In so far as the resistance Ron fluctuates around a median resistance value Ronmed and in so far as the resistance value Roff of the dielectric material in the high resistance state HRS is determined for each cycle—as explained hereafter—the value of the resistance Roff fluctuates around a median resistance value Roffmed.

Figure 4A:
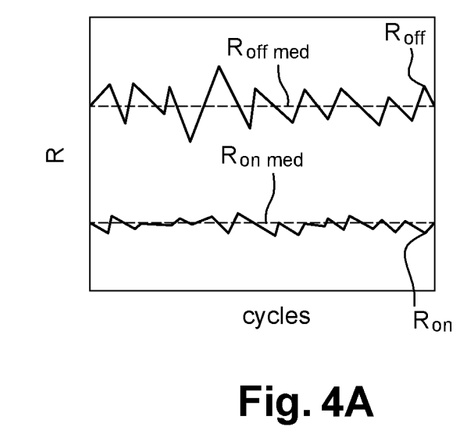
FIGS. 4A and 4B represent examples of evolution and distribution of the resistances Roff and Ron, during an implementation of the method according to an embodiment of the invention.
Figure 4B:
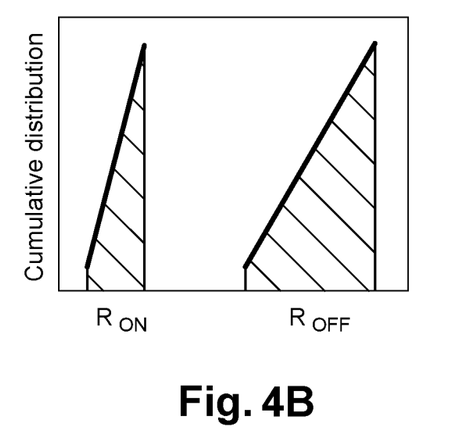

FIG. 4A represents examples of fluctuation of the resistances Ron and Roff of a same memory cell, over several cycles. FIG. 4B represents examples of the cumulative distribution of resistance values Ron and Roff. In particular, FIG. 4A represents the curve of the resistance values Roff which fluctuate around a first median resistance value Roffmed and the curve of the resistance values Ron which fluctuate around a second median resistance value Ronmed.

Since the filament within the dielectric material has a variable shape at the end of each writing operation and erasure operation, the resistance of the dielectric material, which depends on the fluctuation of the filament, has stochastic values, not just in the high resistance state but also in the low resistance state. The method of an embodiment of the invention proposes adjusting the writing conditions to apply during the writing operation(s) of the next cycle as a function of the erasure conditions applied during the final erasure operation of the preceding cycle, so as to compensate, at each cycle, the fluctuations of the filament. Thus, the fact of determining, at each cycle, the writing conditions to use at the following writing operation make it possible to write data with optimal writing conditions that limit the generation of defects in the memory cell.

The adjustment of the writing conditions to apply at the following cycle is carried out by comparing the erasure conditions applied during the final erasure operation of the preceding cycle with a predetermined median erasure value. This median erasure value may be the erasure value corresponding to the median resistance value Ronmed represented in FIG. 4A. The median erasure value follows a dependency law Ld linking the writing conditions to the erasure conditions. This dependency law makes it possible, from the erasure conditions of the memory cell applied to a cycle n−1, to define the writing conditions to apply at the following cycle n. The writing conditions are thus adjusted as a function of the read erasure conditions. An example of a dependency law Ld will be described in greater detail, hereafter, in relation with FIG. 5. According to an alternative, the dependency law Ld may be discretised; the condition of erasure is then compared with a median value of the erasure conditions and the writing conditions to apply to the following writing operation are determined as a function of this median value.

According to certain embodiments, the writing and erasure conditions may be, respectively, a writing and erasure voltage, that is to say a potential difference applied between the two electrodes of a stack to make it possible to write or erase data on/from the memory cell. In such embodiments, the voltage value applied between the electrodes is variable and the duration of application of this voltage is constant. According to other embodiments, the writing and erasure conditions may be the duration of application of the voltage to the electrodes—the duration also being able to correspond to a number of pulses applied to the electrodes. In these embodiments, the duration (or the number of pulses) is variable and the voltage value applied is constant. Indeed, those skilled in the art will understand that, due to the equivalence known in the field of resistive random access memories between the voltage level and the duration of placing under voltage, it is possible to apply to the electrodes, indiscriminately, either a voltage of constant value with a variable duration, or a voltage of variable value but with a constant duration.

In the examples that will now be described, the writing and/or erasure conditions will be the variable voltage applied between the electrodes of a memory cell, it being understood that similar examples could be implemented with a variable duration of application (or a number of pulses) and a constant voltage value.

Figure 5:
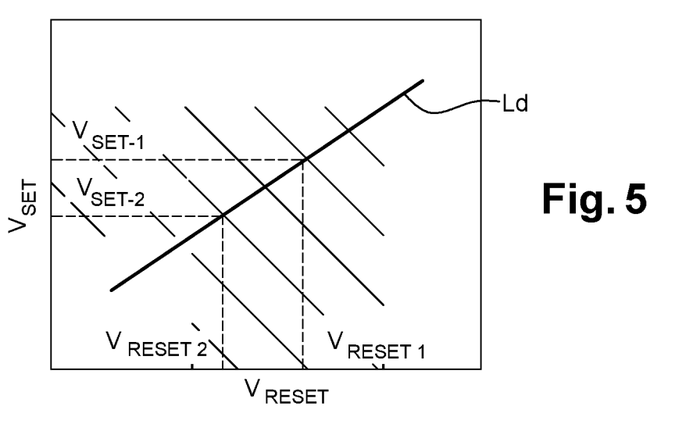
FIG. 5 represents an example of a dependency law used in the method according to an embodiment of the invention.

FIG. 5 represents an example of a dependency law Ld between the erasure voltage Vreset and the writing voltage Vset of a memory cell. According to this example, if the erasure voltage read at the end of the cycle n−1 has for value Vreset1, then the value of the writing voltage at the cycle n will be Vset1, the value Vset1 being defined as a function of the value Vreset1 and the dependency law Ld. Similarly, if the erasure voltage read at the end of the cycle n−1 has for value Vreset2, then the value of the writing voltage, defined as a function of the value Vreset2 and the dependency law Ld, will be Vset2 at the cycle n. Thus, the higher the value of the voltage necessary for the erasure of data in the course of a cycle, the higher the value of the voltage necessary for the writing of data at the following cycle. Conversely, the lower the value of the voltage necessary for the erasure of data in the course of a cycle, the lower the value of the voltage necessary for the writing of data at the following cycle.

The fact of applying, at each cycle, a writing voltage in correspondence with the erasure voltage that was necessary at the preceding cycle to reach the target resistance (that is to say the resistance Roff enabling erasure) makes it possible to limit defects generated in the dielectric material while taking into account the stochastic evolution of the resistance state of the dielectric material.

To optimise the method of an embodiment of the invention, it is desirable that the memory cell is erased in an optimal manner in the course of the preceding cycle. To erase the memory cell in an optimal manner, that is to say with a resistance value Roff adapted to the state of the dielectric material, several methods may be implemented.

For example, the smart programming method, described in the prior art, may be implemented so as to reach progressively the resistance value Roff at which the memory cell is erased. As soon as the value Roff is reached, the erasure voltage value making it possible to reach this resistance value Roff is read and memorised to be used later in the operation of determining the writing voltage.

Other methods may also be implemented to make it possible to erase in an optimal manner the memory cell such as, for example, a method in which, at the end of each writing and erasure cycle, the erasure conditions that will be implemented in the following writing and erasure cycle are determined. These erasure conditions are determined such that, in the high resistance state HRS, the resistance Roff of the dielectric material fluctuates around a median resistance value Roffmed. Such a method may, for example, propose:

reading, at the end of a writing operation of a cycle n−1, the resistance value of the dielectric material;

comparing this read resistance value with predetermined reference values;

determining the erasure conditions from the result of this comparison;

applying to the memory cell, during the erasure operation of the following cycle n, the determined erasure conditions;

memorising these erasure conditions, for example the erasure voltage value making it possible to reach the resistance value Roff, in order that they can be used later in the operation of determining the writing voltage.

Those skilled in the art will understand that one or the other of the methods cited above may be implemented, as may other methods from the moment that the other methods make it possible to reach the resistance value Roff the best adapted to the erasure of data inscribed in the memory cell. The method to apply to determine the erasure conditions may be chosen, for example, in taking account of potential constraints, such as time, voltage, algorithm constraints, etc.

The erasure conditions, for example the erasure voltage, which make it possible to reach the resistance value Roff are the base data for determining the writing conditions of the memory cell in the course of the next cycle. These writing conditions at the next cycle (or following cycle) are defined as being the image of the erasure conditions of the preceding cycle by the dependency law Ld.

The dependency law Ld between the erasure conditions and the writing conditions is a predefined law, determined during a preliminary calibration step. The dependency law differs according to the technology of the memory. For example, an OxRRAM type resistive random access memory with a layer of hafnium oxide as dielectric material will have a dependency law different to that of a CBRAM memory with a layer of germanium sulphate. Each type of resistive random access memory thus responds to a predetermined dependency law, recorded within the memory to enable the determination of the writing conditions.

In certain embodiments, the dependency law Ld links the erasure voltage of a cycle with the writing voltage of a following cycle. In other embodiments, the dependency law links the duration of application (or the number of pulses) of a writing voltage of constant value, with the duration of application (or the number of pulses) of an erasure voltage of constant value.

Whatever the embodiment, the dependency law may be determined by calculation, for example, by simulation using RRAM models. This dependency law Ld may also be determined experimentally, by successive measurements.

Figure 7:
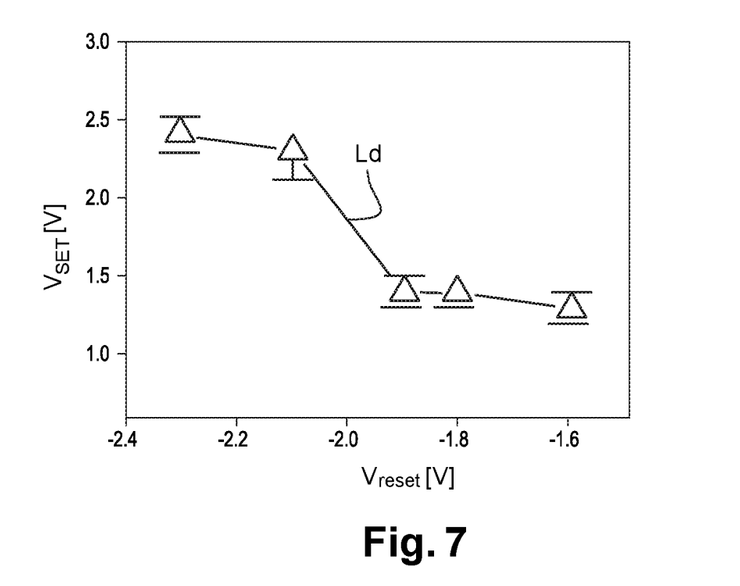
FIG. 7 represents an example of a dependency law LD constructed experimentally for a particular CBRAM memory.

The dependency law Ld may, for example, be determined according to the following experimental method: Starting with written cells (state LRS), different erasure conditions are applied, for example different voltage Vreset or time Treset values. The state HRS is then reached. Writing pulses, with a constant pulse time, are applied to these erased cells, while increasing the writing voltage at each pulse. The voltage from which the memory cell is written (thus switches to the state LRS) is defined as the writing voltage. An example of an experimental curve of Vset as a function of Vreset for a CBRAM $Al_2O_3$/CuTe memory is represented in FIG. 7. This curve constitutes an example of dependency law Ld used in the method of the invention.

Whatever the dependency law chosen, the method according to an embodiment of the invention comprises the following steps:
  at the end of a cycle n−1, reading the value of the erasure voltage applied during the final erasure operation;
  recording this erasure voltage value in at least one memory cell of the resistive random access memory;
  determining the writing conditions to use at the following cycle n, from the recorded value of the erasure voltage and the predefined dependency law;
  applying to the memory cell the writing conditions determined for the cycle n.

According to an alternative, each cycle comprises a writing operation and an erasure operation. The method is then implemented at the end of each erasure operation in order to determine the writing conditions for each writing operation. This alternative has the benefit of offering great precision in the determination of the writing conditions.

According to another alternative, each cycle comprises an alternation of several operations of writing and several operations of erasure, for example ten erasure operations and ten writing operations. The method is then implemented regularly after several alternating writing and erasure operations in order to determine the writing conditions to apply to all the writing operations of the following cycle. This alternative has the benefit of being more rapid than the preceding alternative since the same writing conditions are applied to several writing operations.

The operation of reading the value of the erasure conditions of the memory cell at the preceding cycle comprises a comparison of this value with reference values. These reference values may be generated in a programming circuit described later. When the erasure conditions are the erasure voltage value, the comparison may be carried out by means of comparators connected to voltage generators as described hereafter.

As explained previously, the erasure conditions read at the preceding cycle are memorised in memory cells of the resistive random access memory. According to certain embodiments, the memory space dedicated to the implementation of the method of the invention may be optimised by only memorising, for example, the conditions of the memory cells considered as the most sensitive by the user such as, for example, the cells the most often erased and rewritten of the resistive random access memory and/or the memory cells using the highest programming voltages.

Indeed, the method of an embodiment of the invention—with adaptation of the writing conditions—may only be implemented for a fraction of the total memory, which corresponds to a reduced number of memory cells. This reduced number of memory cells may be chosen, by the user, such as sensitive cells.

According to certain embodiments, an associative memory is used to store the addresses and erasure conditions: the "tag" part of this associative memory may, for example, be realised in ReRAM because not written very often. The erasure conditions are encoded in SRAM, a technology not subject to wear. The method of an embodiment of the invention is only used on a small portion of the memory because the size of SRAM memories is greater than that of ReRAM.

According to certain embodiments, the memory space dedicated to the implementation of the method of an embodiment of the invention may be optimised by using the cache memory zones of the resistive random access memory for storing momentarily the values of the erasure conditions and using them at the moment where the cache memory has to be emptied to store therein another data. The cache memory is then used to store successively several data of different types.

According to certain embodiments, the memory space dedicated to the storage of the read conditions may be optimised by only storing a tendency of the writing conditions to apply, this tendency being able to be more or less precise. For example, to reduce the number of memory cells required for the storage of the read conditions, it is possible to encode, on a single memory cell, the tendencies "increase the writing voltage" and "decrease the writing voltage". While increasing the number of memory cells, the nuance of the tendency may be refined; for example, by encoding on two memory cells, it is possible to encode the information "apply the median voltage+n %", "apply the median voltage−n %", "apply the median voltage+2n %" and "apply the median voltage−2n %".

The dependency law also has to be stored in the resistive random access memory. However, since this dependency law is valid for all the memory cells of a same memory and throughout the lifetime of the memory, it does not need to be refreshed and may be stored in a read-only memory zone.

Those skilled in the art will understand that a high number of memory cells dedicated to the implementation of the method of the invention make it possible to encode refined programming conditions. Moreover, those skilled in the art will understand that several of the embodiments described previously may be implemented simultaneously in order to optimise as best as possible the ratio between the memory space dedicated to the implementation of the method and the precision of the determination of the programming conditions.

The method according to an embodiment of the invention may be implemented in a device for programming a resistive random access memory. The device may comprise a programming circuit, connected to the upper and lower electrodes of each memory cell of the memory.

Figure 6A:
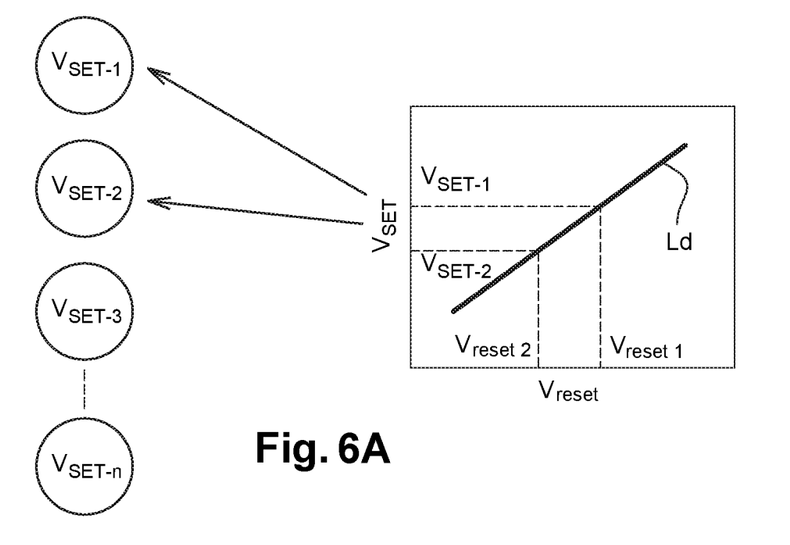
FIGS. 6A and 6B schematically represent two embodiments of the adjustment of the writing conditions of the method of the invention.

According to certain embodiments, the programming circuit comprises a plurality of voltage generators each capable of delivering at least one writing and/or erasure voltage value different to the voltage value delivered by the other generators. Indeed, to apply the writing and/or erasure voltage values determined by the method of the invention, several voltage generators may be required, as represented in FIG. 6A. The programming circuit may then choose, from among the voltage generators, the number and the combination of these generators which make it possible to approach as best as possible the determined writing or erasure voltage value. However, in order to limit the number of voltage generators, each generator may comprise dividing bridges which, by divisions of a reference voltage, make it possible to apply to the electrodes the writing and/or erasure voltage value the closest to the determined value.

Figure 6B:
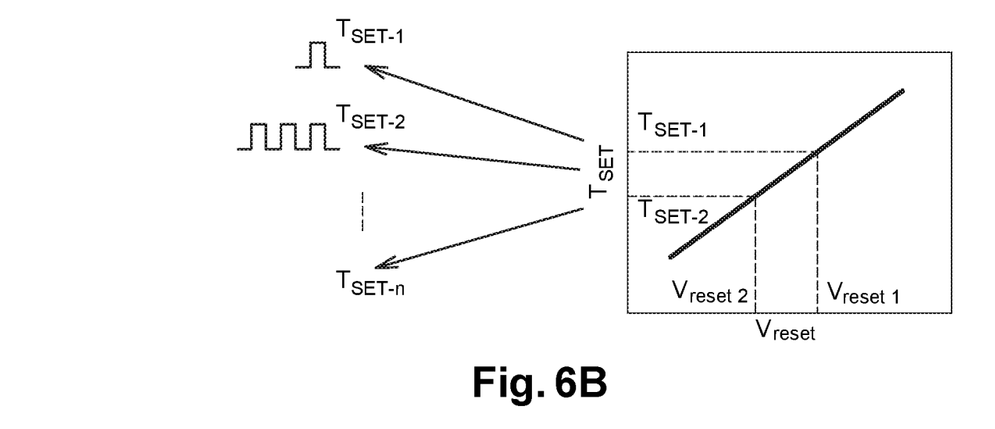

According to certain other embodiments, the programming circuit comprises a single (or several) voltage generator(s) (each) delivering a constant voltage value. This voltage generator is connected to at least one counter and/or one clock capable of controlling the duration or the number of pulses of constant voltage to apply to the electrodes to obtain a result identical to that which would have been obtained with a writing and/or erasure voltage value determined in the embodiments where the voltage is variable. An example of application of the number of pulses at a constant voltage, determined with the method according to the invention, for a writing operation is represented schematically in FIG. 6B.

Thus, the fact of determining, at each cycle, the writing conditions to use at the following cycle, in correspondence with the erasure conditions at the preceding cycle, makes it possible to write data with optimal conditions which limits the generation of defects in the memory cell. The defects generated in the dielectric material are thus compensated at each cycle, before the memory has drifted too much. Indeed, the fact of compensating a resistance drift of the dielectric material rapidly after the birth of the drift makes it possible to stabilise the high or low resistance state, respectively, of the dielectric material.

Thus, the method according to an embodiment of the invention makes it possible to manage the endurance of a resistive random access memory by determining, at each cycle, the writing conditions of each memory cell at the following cycle. The method according to an embodiment of the invention thereby makes it possible to improve the endurance of a resistive random access memory and, consequently, to increase the lifetime of the memory.

Although described through a certain number of examples, alternatives and embodiments, the method for managing endurance according to the invention and the programming device implementing the method includes various alternatives, modifications and improvements which will be obviously apparent to those skilled in the art, it being understood that these alternatives, modifications and improvements form part of the invention, as defined by the claims that follow.

The invention claimed is:

1. A method for managing the endurance of a non-volatile rewritable memory including a plurality of memory cells each comprising an ordered stack of a lower electrode, a layer of dielectric material and an upper electrode, the dielectric material of each stack being capable of switching between:
   a high resistance state, and
   a low resistance state,
a switching between the high resistance state and the low resistance state allowing a writing in the memory cell and a switching between the low resistance state and the high resistance state allowing an erasure in said memory cell, the method comprising the operations of:
   at the end of each writing and erasure cycle of the memory cell, reading the erasure conditions of said memory cell in the course of the final erasure operation of the cycle, and comparing said read erasure conditions with a predetermined median erasure value corresponding to a median resistance value which follows a predetermined dependency law linking the condition of erasure of a cycle with the condition of writing of a following cycle; and
   determining the writing conditions of the memory cell from the results of the comparison, said writing conditions being applied to the electrodes of the stack during writing operations of the following writing and erasure cycle in order to limit the generation of defects in the dielectric material.

2. The method according to claim 1, wherein the writing conditions include a writing voltage value applied between the electrodes of each memory cell, for a constant duration, so that the dielectric material switches from the high resistance state to the low resistance state.

3. The method according to claim 1, wherein the writing conditions include a duration of application of a voltage of constant value between the electrodes of each memory cell, so that the dielectric material switches from the high resistance state to the low resistance state.

4. The method according to claim 1, wherein the dependency law is calibrated prior to any writing and erasure cycle.

5. The method according to claim 1, wherein each writing and erasure cycle comprises an alternating series of at least one writing operation and at least one erasure operation.

6. The method according to claim 1, wherein the read erasure conditions are memorised at least partially up to the following writing and erasure cycle, in at least one memory cell of the memory.

7. A device for programming a non-volatile rewritable memory comprising a programming circuit connected to the electrodes of each memory cell, wherein the device is configured to implement the method according to claim 1.

8. The device according to claim 7, wherein the programming circuit comprises a plurality of voltage generators each capable of generating at least one writing and/or erasure voltage value.

9. The device according to claim 7, wherein the programming circuit comprises at least one voltage generator connected to dividing bridges.

10. The device according to claim 8, wherein the programming circuit comprises at least one voltage generator connected to at least one counter and/or one clock capable of modulating a duration of application of a voltage of constant value to the electrodes.

* * * * *